US012748127B2

(12) United States Patent
Reinmuth

(10) Patent No.: US 12,748,127 B2
(45) Date of Patent: Sep. 29, 2026

(54) MICROELECTROMECHANICAL ACCELERATION SENSOR

(71) Applicant: Robert Bosch GmbH, Stuttgart (DE)

(72) Inventor: Jochen Reinmuth, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 266 days.

(21) Appl. No.: 18/748,473

(22) Filed: Jun. 20, 2024

(65) Prior Publication Data

US 2026/0062281 A1 Mar. 5, 2026

(30) Foreign Application Priority Data

Jun. 29, 2023 (DE) ..................... 10 2023 206 146.5

(51) Int. Cl.
*B81B 3/00* (2006.01)
*G01P 15/125* (2006.01)

(52) U.S. Cl.
CPC .......... *G01P 15/125* (2013.01); *B81B 3/0021* (2013.01); *B81B 2201/0235* (2013.01)

(58) Field of Classification Search
CPC ...... G01P 15/02; G01P 15/08; G01P 15/0802; G01P 15/125; G01P 2015/0805; B81B 3/0051; B81B 2201/0235
See application file for complete search history.

(56) References Cited

U.S. PATENT DOCUMENTS

2005/0274185 A1* 12/2005 Lo ........................... G01P 15/18 73/514.01
2007/0034007 A1* 2/2007 Acar ..................... G01P 15/125 73/514.01
2007/0220973 A1* 9/2007 Acar ..................... G01P 15/125 73/504.12
2022/0144623 A1* 5/2022 Reinmuth ............. B81B 3/0027

FOREIGN PATENT DOCUMENTS

DE 102019216535 A1 4/2021
DE 102020212998 A1 4/2022
DE 102020214019 A1 5/2022

* cited by examiner

*Primary Examiner* — Nathaniel J Kolb
(74) *Attorney, Agent, or Firm* — Norton Rose Fulbright US LLP

(57) ABSTRACT

A microelectromechanical acceleration sensor. The sensor has a substrate, a movably suspended heavy mass, four movably suspended lightweight masses, and four electrode systems, and is designed to be at least rotationally symmetrical. The heavy mass laterally encloses the lightweight masses and the electrode systems. Each electrode system has two electrode structures. Each electrode structure has fixed electrodes and movable electrodes. The movable electrodes are connected to the masses. Movable and fixed electrode surfaces interlock and form electrical capacitances. The masses are coupled to one another such that a deflection of the heavy mass parallel to the substrate and in a direction perpendicular to fixed and movable electrode surfaces of two opposing electrode systems causes the lightweight (Continued)

masses connected to the opposing electrode systems to be deflected in the opposite direction.

10 Claims, 11 Drawing Sheets

MICROELECTROMECHANICAL ACCELERATION SENSOR

CROSS REFERENCE

The present application claims the benefit under 35 U.S.C. § 119 of German Patent Application No. DE 10 2023 206 146.5 filed on Jun. 29, 2023, which is expressly incorporated herein by reference in its entirety.

FIELD

The present invention relates to a microelectromechanical acceleration sensor.

BACKGROUND INFORMATION

Certain three-axis microelectromechanical (MEMS) acceleration sensors are described in the related art. Certain sensors with two seismic masses of different weights which are movably suspended via spring elements and coupled to one another via lever elements are described in the related art. The seismic masses have movable electrodes. Formed on the substrate are fixedly anchored electrodes, which, together with the movable electrodes, form variable electrical capacitances depending on acceleration forces, the capacitances serving as measurement signals. A disadvantage of conventional MEMS sensors is that they exhibit undesirable cross-sensitivity in the case of lateral acceleration forces due to a lack of symmetry.

An object of the present invention is to provide an improved microelectromechanical acceleration sensor. This object may be achieved by a microelectromechanical acceleration sensor with features of the present invention. Advantageous developments of the present invention are disclosed herein.

According to an example embodiment of the present invention, a microelectromechanical acceleration sensor comprises a substrate, a heavy mass movably suspended above an upper side of the substrate, four lightweight masses movably suspended above the upper side of the substrate, and four electrode systems arranged above the upper side of the substrate. The heavy mass laterally encloses the lightweight masses and the electrode systems. The electrode systems are arranged such that the microelectromechanical acceleration sensor has a fourfold rotational symmetry with respect to a rotation axis perpendicular to the substrate. Each electrode system has two electrode structures arranged laterally next to one another.

Each electrode structure has a first fixed electrode, a second fixed electrode, a first movable electrode, and a second movable electrode. The first movable electrodes of each electrode system are arranged on sides, facing away from one another, of the electrode structures of a corresponding electrode system and are each firmly connected to the heavy mass. The second movable electrodes of an electrode system are arranged on sides, facing one another, of the electrode structures of a corresponding electrode system and are each firmly connected to a lightweight mass. The first and second fixed electrodes of the electrode structures each have a first and second fixed comb of first and second fixed electrode surfaces, which are oriented perpendicularly to the substrate and project parallel to the substrate in opposite directions. The first and second movable electrodes of the electrode structures each have a first and second movable comb of first and second movable electrode surfaces, which are arranged parallel to the first and second fixed electrode surfaces and project in opposite directions. In each case, a first movable comb and a first fixed comb of the electrode structures interlock and form first electrical capacitances. In each case, a second movable comb and a second fixed comb of the electrode structures interlock and form second electrical capacitances. The masses are coupled to one another such that a deflection of the heavy mass parallel to the substrate and in a direction perpendicular to fixed and movable electrode surfaces of two opposing electrode systems causes the lightweight masses connected to the opposing electrode systems to be deflected in the opposite direction.

The heavy mass and the lightweight masses may also be referred to as seismic masses since they are suspended movably above the substrate and, due to their inertia, experience a deflection in response to accelerations acting on the microelectromechanical acceleration sensor, which is also referred to below as a MEMS sensor for short. The heavy mass is heavier than a total mass of the lightweight masses. The MEMS sensor thus has a mass asymmetry. The mass difference between the heavy mass and the lightweight masses can be selected differently depending on the application range of the MEMS sensor in order thereby to adjust a sensitivity of the MEMS sensor. The lightweight masses have the same mass due to the symmetry of the MEMS sensor.

As a result of the deflection of the seismic masses, a distance between the fixed and movable electrode surfaces of interlocking combs changes, whereby the electrical capacitances are changed, which is a measure of an acceleration acting perpendicularly to the electrode surfaces of an electrical capacitance. The MEMS sensor has a total of four electrode systems, two opposing electrode systems with electrode surfaces parallel to one another being provided in each case for measuring accelerations in a first direction parallel to the substrate. The other two electrode systems are likewise opposing one another and have electrode surfaces parallel to one another. However, they are provided for measuring accelerations in a second direction parallel to the substrate and perpendicular to the first direction.

The term "cross-sensitivity of the MEMS sensor" is to be understood to mean that acceleration forces that have a component along the first direction generate a signal not only in the first direction but also in the second direction. Since the microelectromechanical acceleration sensor is rotationally symmetrical, it can advantageously at least be achieved that the MEMS sensor has the same cross-sensitivity and/or sensitivity to rotational vibrations in relation to the first and the second direction. A rotating mirror axis extends perpendicularly through a center point of the substrate. Due to the rotationally symmetrical arrangement of the electrode systems of the MEMS sensor, the electrode systems have an azimuthal offset of 90° to one another.

In one example embodiment of the present invention, the electrode systems are axially symmetrical with respect to an axis of symmetry extending perpendicularly to the fixed and movable electrode surfaces and between the electrode structures. In a more general embodiment, the microelectromechanical acceleration sensor has four axes of symmetry parallel to the substrate.

The symmetrical arrangements of these embodiments have the advantage that the MEMS sensor has no cross-sensitivity and/or no sensitivity to rotational vibrations. In these embodiments, the electrode systems are not only arranged rotationally symmetrically. Their arrangement also has mirror symmetry with respect to the four axes of symmetry. For this reason, the MEMS sensor can be described as fully symmetrical.

This arrangement of the elements of the MEMS sensor also allows producing very sensitive three-axis acceleration sensors with a high mass asymmetry between the heavy mass and the lightweight mass. With the same sensitivity and surface area in comparison to conventional sensors, where sensitivity refers to a deflection of a seismic mass per gram, it is therefore possible to provide a MEMS sensor that has a restoring force that is, for example, four to six times higher. This advantageously prevents a tendency to stick, i.e., adhesion of a seismic mass as a result of an acceleration vertical to the substrate.

A high mass asymmetry also has the advantage that thermal noise of the MEMS sensor can be reduced in comparison to conventional sensors. For example, it is possible thereby to halve a signal strength of the thermal noise. Thermal noise forms the largest portion of a total noise of the MEMS sensor. For this reason, it is possible to significantly reduce a total noise signal of the MEMS sensor.

In one example embodiment of the present invention, the fixed and movable electrode surfaces of the first and second electrical capacitances are arranged such that directly adjacent first and directly adjacent second electrical capacitances of the electrode systems are in each case formed in opposite directions. As a result, the electrical capacitances of different electrode structures of an electrode system are formed in opposite directions. The electrical capacitances of each of the electrode structures are, however, each formed in the same direction. In this embodiment, the arrangement of the electrode structures of the electrode systems can in each case have a translational symmetry, i.e., a second electrode structure of an electrode system can be produced by a translation of a first electrode structure parallel to the substrate and parallel to the electrode surfaces. Because directly adjacent first and directly adjacent second electrical capacitances of the electrode systems are in each case formed in opposite directions, acceleration signals can be tapped locally. In this case, the MEMS sensor is not fully symmetrical but only at least rotationally symmetrical.

In one example embodiment of the present invention, the lightweight masses on sides, facing one another, of the electrode structures of the electrode systems are each connected to two inner spring elements, which, in the rest position of the masses, are aligned perpendicularly to the fixed and to the movable electrode surfaces. On sides, facing away from one another, of the electrode structures of the electrode systems, the heavy mass is in each case connected to two outer spring elements, which, in the rest position of the masses, are aligned perpendicularly to the fixed and to the movable electrode surfaces. Inner and outer spring elements are in each case connected in pairs to a lever element, which, in the rest position of the masses, is aligned parallel to the fixed and to the movable electrode surfaces, such that an inner spring element, an outer spring element and a lever element in each case laterally enclose an electrode structure of an electrode system. Via a further spring element, which projects between the fixed combs of an electrode structure and, in the rest position of the masses, is arranged perpendicularly to the lever elements, the lever elements are each connected to suspensions arranged on the upper side of the substrate. Advantageously, the seismic masses are coupled to one another and suspended via a plurality of spring elements, whereby an averaging of offset effects of the individual spring elements can be brought about.

In one example embodiment of the present invention, directly adjacent inner spring elements are connected to one another. Alternatively or additionally, in another embodiment, directly adjacent outer spring elements are connected to one another. However, if both inner and outer spring elements are connected to one another, a mass difference between the lightweight masses and the heavy mass decreases, but robustness of the MEMS sensor increases.

Due to soldering processes during the production of the microelectromechanical acceleration sensor and due to external influences, the substrate may bend. Since the seismic masses and the fixed electrodes are not suspended or anchored at the same location on the substrate, such substrate bending results in a displacement of the seismic mass relative to the fixed electrodes, which cannot be distinguished from an applied acceleration. This produces an undesirable false signal.

In one example embodiment of the present invention, the fixed combs of an electrode structure are each connected to a common anchor. The suspensions and the anchors of the electrode structures are arranged one behind the other in a direction perpendicular to the fixed and movable electrode surfaces of the electrode structures. In relation to a direction perpendicular to the electrode surfaces of the electrode structures, the first movable electrode surfaces and the second movable electrode surfaces of the electrode structures are each arranged on opposing sides of the fixed electrode surfaces of the first and second fixed combs.

Advantageously, a displacement of a suspension relative to an anchor in a direction perpendicular to the electrode surfaces of the relevant electrode structure, which displacement occurs due to a bending of the substrate, can cause an increase in a distance between the electrode surfaces of the first electrical capacitances and a decrease in a distance between the electrode surfaces of the second electrical capacitances. In a capacitive sum signal, the increases and decreases in the distances between the first and second electrical capacitances of an electrode structure compensate one another, as a result of which no change in capacitance takes place overall. A displacement of the anchors of the fixed electrodes relative to the suspensions in the same direction due to a bending of the substrate or some other cause can therefore be compensated. This advantageous arrangement is implemented twice in each electrode system since the first movable electrode surfaces and the second movable electrode surfaces of all electrode structures are arranged on opposing sides of the fixed electrode surfaces of the first and second fixed combs. As a result, compensation of the effects of the substrate bending can take place in a segmented manner, whereby a sensitivity of the MEMS sensor can advantageously be reduced.

In one example embodiment of the present invention, the lightweight masses are connected to one another via connecting bars. As a result, the lightweight masses are coupled to one another. A disadvantage of MEMS sensors is that they have a plurality of lightweight seismic masses. In other words, a lightweight seismic mass typically has at least two portions. The lightweight masses are laterally enclosed by the heavy mass. In order to provide sensitive MEMS sensors, a large mass difference between the lightweight masses and the heavy mass is advantageous. Connecting bars between the lightweight masses of the lightweight mass can therefore be dispensed with. However, if there is no connection between the lightweight masses, the exact parallel movement of the lightweight masses to the substrate in the case of a deflection is not given, since they can straighten up on sides facing one another. This is accompanied by an undesired reduction of a capacitive measurement signal of a MEMS acceleration sensor relative to a basic capacitance. In addition, this reduces a maximum deflection of the seismic masses in the vertical direction.

The microelectromechanical acceleration sensor has an advantage that the lightweight masses are deflectable parallel to the substrate even without being connected to one another via connecting bars, as a result of which the disadvantages of conventional sensors are overcome. A connection of the lightweight masses can in particular be advantageous for small MEMS sensors with large detection surfaces for accelerations in the direction perpendicular to the substrate.

In one example embodiment of the present invention, the heavy mass has additional movable electrode surfaces. Additional fixed electrode surfaces are arranged on the upper side of the substrate. In the rest position of the heavy mass, the additional fixed and the additional movable electrode surfaces are arranged parallel to one another and to the substrate, are arranged opposing one another and form additional electrical capacitances. The masses are coupled such that a deflection of the heavy mass in a direction perpendicular to the substrate causes the lightweight masses to be deflected in the opposite direction. This advantageously makes it possible to also measure accelerations in a third direction vertical to the substrate.

The additional electrical capacitances can advantageously be distributed over the region of the heavy mass in order better be able to compensate for influences of substrate bending via segmented detection.

A microelectromechanical acceleration sensor (MEMS sensor) according to an example embodiment of the present invention, is explained in detail below with reference to schematic figures.

DETAILED DESCRIPTION OF EXAMPLE EMBODIMENTS

Figure 1:
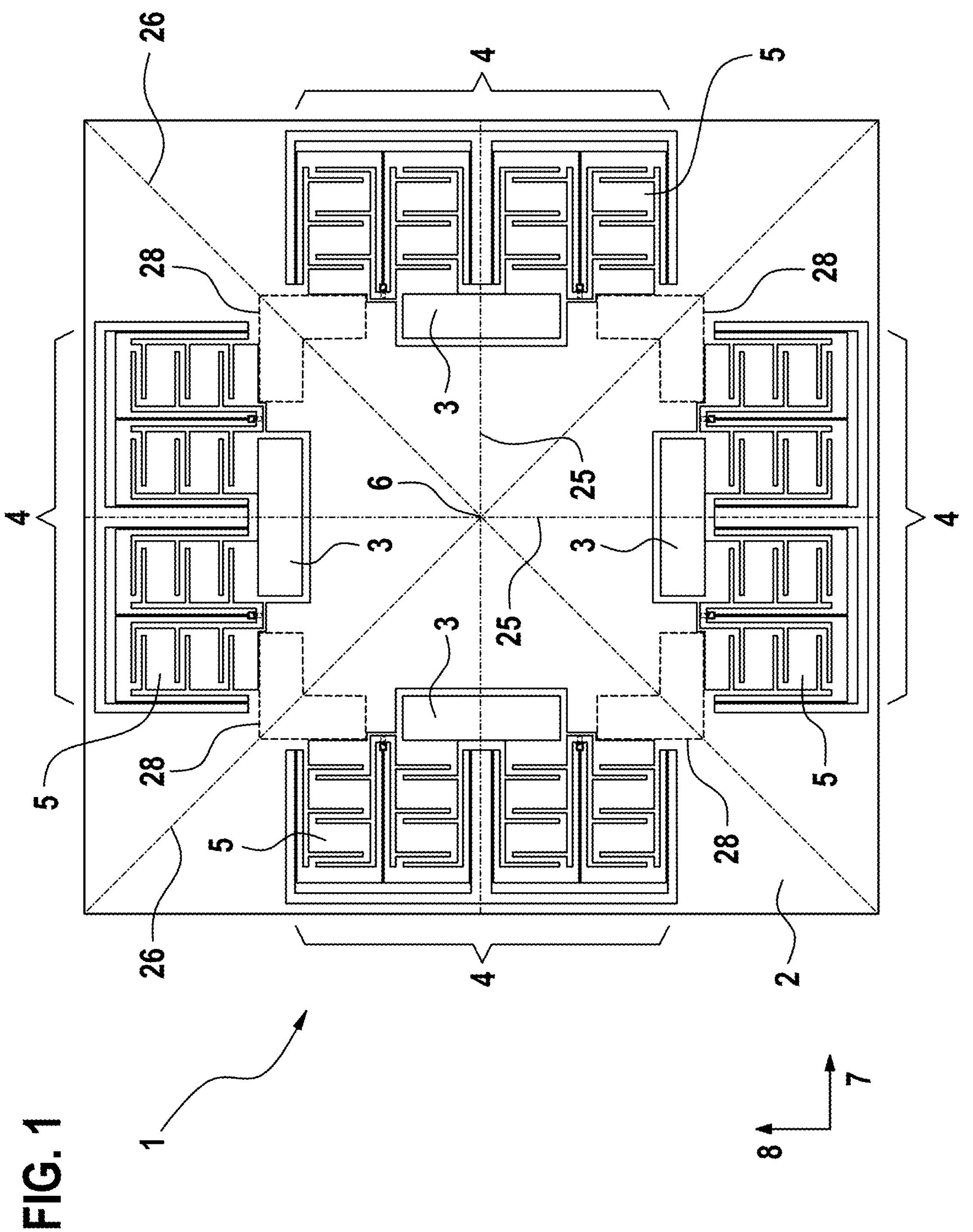
FIG. 1 shows a MEMS sensor according to a first example embodiment of the present invention in a plan view.

FIG. 1 schematically shows a microelectromechanical acceleration sensor 1 according to a first embodiment in a plan view. The microelectromechanical acceleration sensor 1 has a substrate.

The substrate is not shown in FIG. 1 for the sake of simplicity, since it is arranged below the elements shown. The substrate comprises silicon by way of example. The elements described below of the microelectromechanical acceleration sensor 1, which are arranged above an upper side of the substrate, also comprise silicon by way of example. The substrate and the further elements may alternatively or additionally also comprise a different material.

A movably suspended heavy mass 2 is arranged above the upper side of the substrate. In addition, four lightweight masses 3 are arranged movably suspended above the upper side of the substrate. The heavy mass 2 and the lightweight masses 3 may also be referred to as seismic masses 2, 3. Furthermore, the microelectromechanical acceleration sensor 1 has four electrode systems 4 arranged above the upper side of the substrate. The heavy mass 2 laterally encloses the lightweight masses 3 and the electrode systems 4 in each case. By way of example, FIG. 1 shows that the heavy mass 2 has four recesses 5. An electrode system 4 is arranged in each recess 5. However, it is also possible that the heavy mass 2 has only one common recess 5 for all electrode systems 4. In this case, a region of the heavy mass 2, which is substantially formed between the lightweight masses 3, is omitted. However, it is advantageous to provide a separate recess 5 for each electrode system 4 in order to achieve the greatest possible mass asymmetry between the heavy mass 2 and the lightweight masses 3 or a total mass of the lightweight masses 3.

The electrode systems 4 are arranged such that the microelectromechanical acceleration sensor 1 has a fourfold rotational symmetry with respect to a rotation axis 6 perpendicular to the substrate. In other words, directly adjacent electrode systems 4 have an azimuthal offset of 90° from one another in each case. The electrode systems 4 can thus be transferred into one another by a rotation of 90° about the rotation axis 6. For this reason, the electrode systems 4 are designed identically, i.e., the electrode systems 4 are designed to be congruent except for tolerances during manufacture.

The electrode systems 4 are designed to detect acceleration forces acting laterally in relation to the substrate. Two electrode systems 4 arranged opposing one another are in each case designed to measure acceleration forces along a first direction 7 parallel to the substrate and parallel to a connecting line between the opposing electrode systems 4, which first direction may also be referred to as the x-direction, and along a second direction 8 likewise parallel to the substrate and perpendicular to the first direction 7, which second direction may also be referred to as the y-direction. Due to its rotational symmetry, the MEMS sensor 1 has at least the same cross-sensitivity along the first direction 7 and along the second direction 8.

Figure 2:
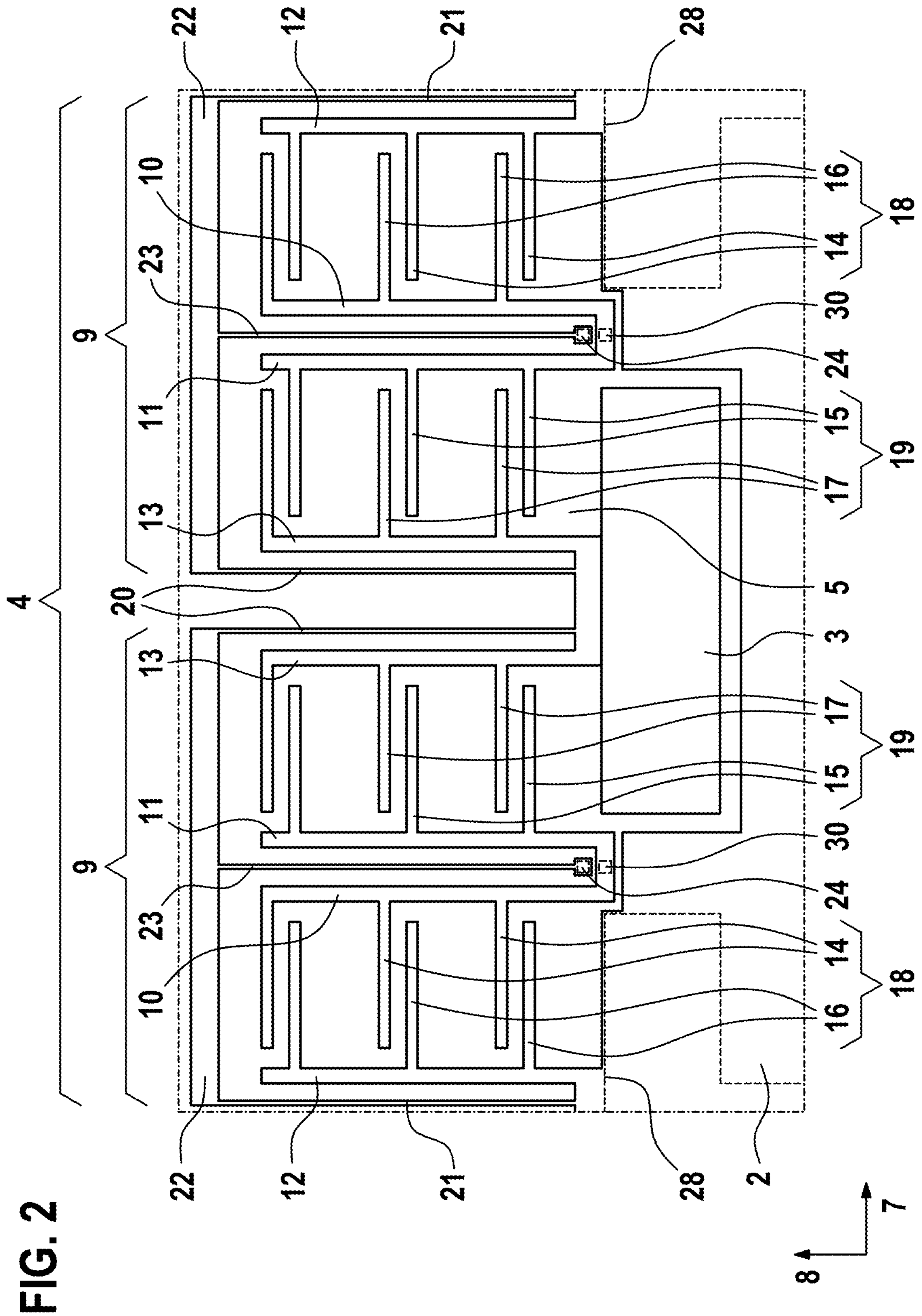
FIG. 2 shows an enlarged detail of the MEMS sensor of FIG. 1.

FIG. 2 schematically and by way of example shows one of the electrode systems 4 of the MEMS sensor 1 of FIG. 1 in a plan view. Due to the symmetry of the MEMS sensor 1, the following description accordingly also applies to the other electrode systems 4. The previously used reference signs are retained.

Each electrode system 4 comprises two electrode structures 9 arranged laterally next to one another. Each electrode structure 9 has a first fixed electrode 10, a second fixed electrode 11, a first movable electrode 12, and a second movable electrode 13. The first movable electrodes 12 of the electrode systems 4 are arranged on sides, facing away from one another, of the electrode structures 9 of the corresponding electrode systems 4 and are each firmly connected to the heavy mass 2. The second movable electrodes 13 of the electrode systems 4 are each arranged on sides, facing one another, of the electrode structures 9 of the corresponding electrode systems 4 and are each firmly connected to a lightweight mass 3.

The first and second fixed electrodes 10, 11 of the electrode structures 9 each have a first and second fixed comb of first fixed electrode surfaces 14 and second fixed electrode surfaces 15, which are oriented perpendicularly to the substrate and project parallel to the substrate in opposite directions. The fixed electrode surfaces 14, 15 of the first and second fixed electrodes 10, 11 are each mechanically and electrically connected to one another via connecting elements of the fixed electrodes 10, 11 and in each case form a comb.

The first and second movable electrodes 12, 13 of the electrode structures 9 each have a first and second movable comb of first and second movable electrode surfaces 16, 17, which are arranged parallel to the first and second fixed electrode surfaces 14, 15 and project in opposite directions. The movable electrode surfaces 16, 17 of the first and second movable electrodes 12, 13 are likewise each mechanically and electrically connected to one another via connecting elements of the fixed electrodes 10, 11 and in each case form a comb.

In each case, a first movable comb of first movable electrode surfaces 16 and a first fixed comb of first fixed electrode surfaces 14 of the electrode structures 9 interlock and form first electrical capacitances 18. In each case, a second movable comb of second movable electrode surfaces 17 and a second fixed comb of second fixed electrode surfaces 15 of the electrode structures 9 interlock and form second electrical capacitances 19.

On sides, facing one another, of the electrode structures 9 of the electrode systems 4, the lightweight masses 3 are each connected to two inner spring elements 20, which, in the rest position of the seismic masses 2, 3, are aligned perpendicularly to the fixed and to the movable electrode surfaces 14, 15, 16, 17. On sides, facing away from one another, of the electrode structures 9 of the electrode systems 4, the heavy mass 2 is in each case connected to two outer spring elements 21, which, in the rest position of the seismic masses 2, 3, are aligned perpendicularly to the fixed and to the movable electrode surfaces 14, 15, 16, 17.

Inner and outer spring elements 20, 21 are connected to one another in pairs via a lever element 22. A first spring element 20 and a second spring element 21 are thus in each case connected to one another by means of a lever element 22. In the rest position of the seismic masses 2, 3, the lever elements 22 are aligned parallel to the fixed and to the movable electrode surfaces 14, 15, 16, 17 of an electrode system 4. The spring elements 20, 21 are connected to one another via the lever elements 22 such that an inner spring element 20, an outer spring element 21 and a lever element 22 in each case laterally enclose an electrode structure 9 of an electrode system 4. The spring elements 20, 21, the lever elements 22, the further spring elements 23 and the suspensions 24 are thus each also arranged within the recesses 5 and are laterally enclosed by the heavy mass 2.

Via a further spring element 23, which projects between the fixed combs of an electrode structure 9 and, in the rest position of the seismic masses 2, 3, is arranged perpendicularly to the lever elements 22 and parallel to the spring elements 20, 23, the lever elements 22 are also each connected to suspensions 24 arranged on the upper side of the substrate.

Due to this arrangement of the spring elements 20, 21, the lever elements 22 and the further spring elements 23 of the MEMS sensor 1, the seismic masses 2, 3 are movably suspended. However, other variants of the suspension in which the spring elements 20, 21, the lever elements 22 and the further spring elements 23 are differently arranged and connected to one another are also possible. It must only be ensured that the seismic masses 2 and 3 are coupled to one another.

Directly adjacent inner spring elements 20 of the MEMS sensor 1 can be connected to one another as shown in the exemplary representations of FIGS. 1 and 2. The inner spring elements 20 are also, by way of example, connected to one another in a region of the lightweight masses 3. In the exemplary embodiment of the MEMS sensor 1 of FIGS. 1 and 2, directly adjacent outer spring elements 21 are additionally connected to one another. They are respectively connected to one another in a region of the heavy mass 2 and between adjacent lightweight masses 3. However, the inner and/or outer spring elements 20, 21 do not necessarily have to be connected to one another or may also be connected to one another in other regions. What is to be considered here is that a mass asymmetry of the MEMS sensor 1 is influenced by a connection of the inner and/or outer spring elements 20, 21 such that it is reduced. At the same time, however, the MEMS sensor 1 is more robust as a result.

The MEMS sensor 1 according to the first embodiment is designed, by way of example, such that the electrode systems 4 are axially symmetrical. The electrode systems 1 are each axially symmetrical with respect to a first axis of symmetry 25 extending perpendicularly to the fixed and movable electrode surfaces 14, 15, 16, 17 and between the electrode structures 9. With reference to FIG. 1, the MEMS sensor 1 has two first axes of symmetry 25, which have an azimuthal offset of 90° from one another. In addition, the MEMS sensor has two second axes of symmetry 26, which each have an azimuthal offset of 45° to a first axis of symmetry 25. The first axes of symmetry 25 and the second axes of symmetry 26 intersect one another in a region between the lightweight masses 3, for example in a center point of the MEMS sensor 1. As a result, the MEMS sensor 1 is completely symmetrical.

Figure 3:
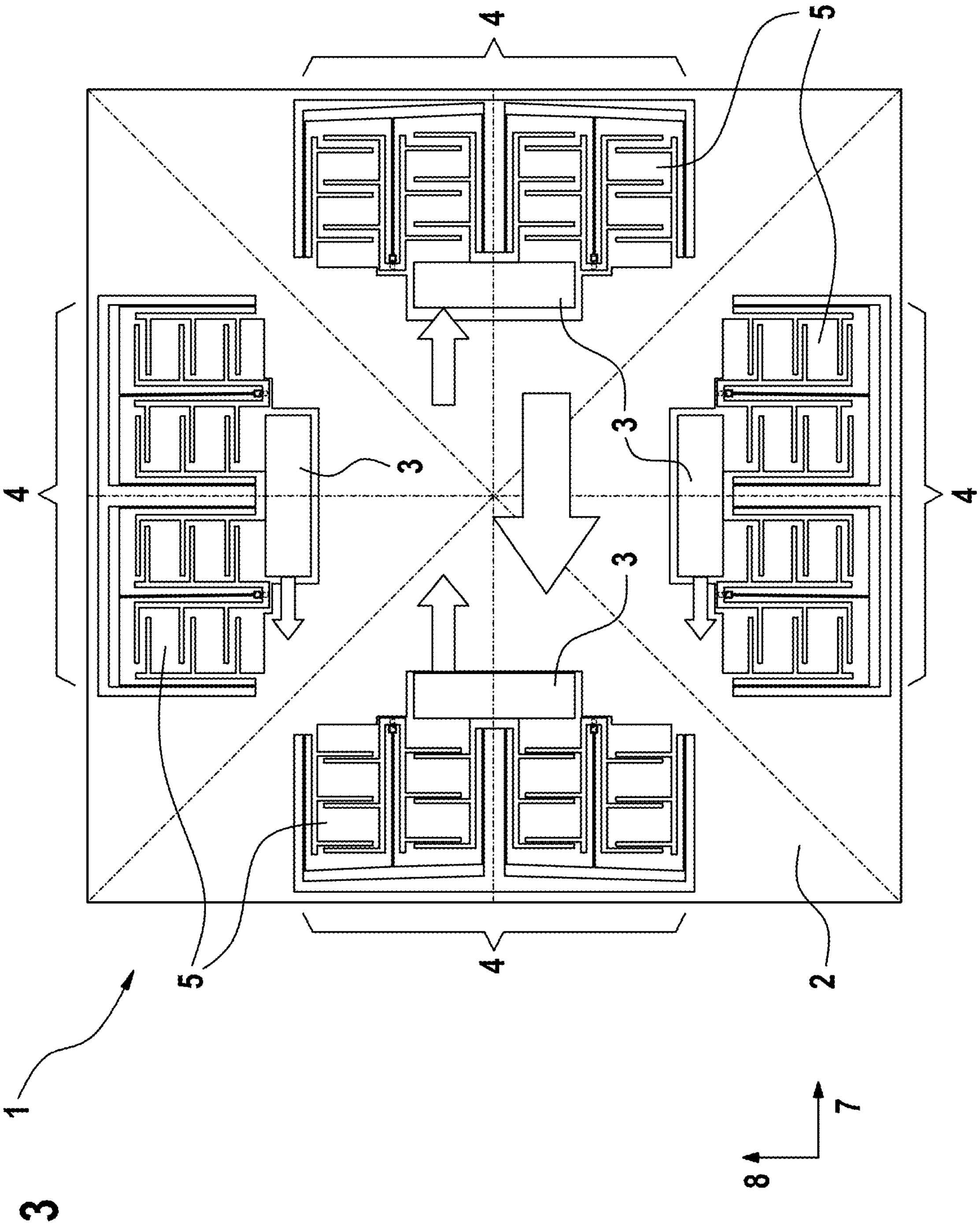
FIG. 3 shows the MEMS sensor of FIG. 1 in a plan view, with a lateral acceleration acting.

FIG. 3 schematically shows the MEMS sensor 1 of FIG. 1 in a plan view. The previously used reference signs are retained. In contrast to FIG. 1, the MEMS sensor 1 in FIG. 3 is shown in a state in which, by way of example, an acceleration with a component along the first direction 7 acts. However, due to the symmetry of the MEMS sensor 1, the following description also applies analogously to the case of acceleration forces parallel to the second direction. It should be noted that acceleration forces can be detected if they have a component perpendicular to fixed and movable electrode surfaces 14, 15, 16, 17, 18.

Due to an inertia of the seismic masses 2, 3 and due to the fact that the seismic masses 2, 3 are movably suspended, a deflection of the seismic masses 2, 3 is caused. Via the spring elements 20, 21, the lever elements 22 and the further spring elements 23, the seismic masses 2, 3 are coupled to one another such that a deflection of the heavy mass 2 parallel to the substrate and in a direction perpendicular to fixed and movable electrode surfaces 14, 15, 16, 17 of two electrode systems 4 that are opposing in the first direction 7 causes the lightweight masses 3 connected to the electrode systems 4 that are opposing in the first direction 7 to be deflected in the opposite direction.

Figure 4:
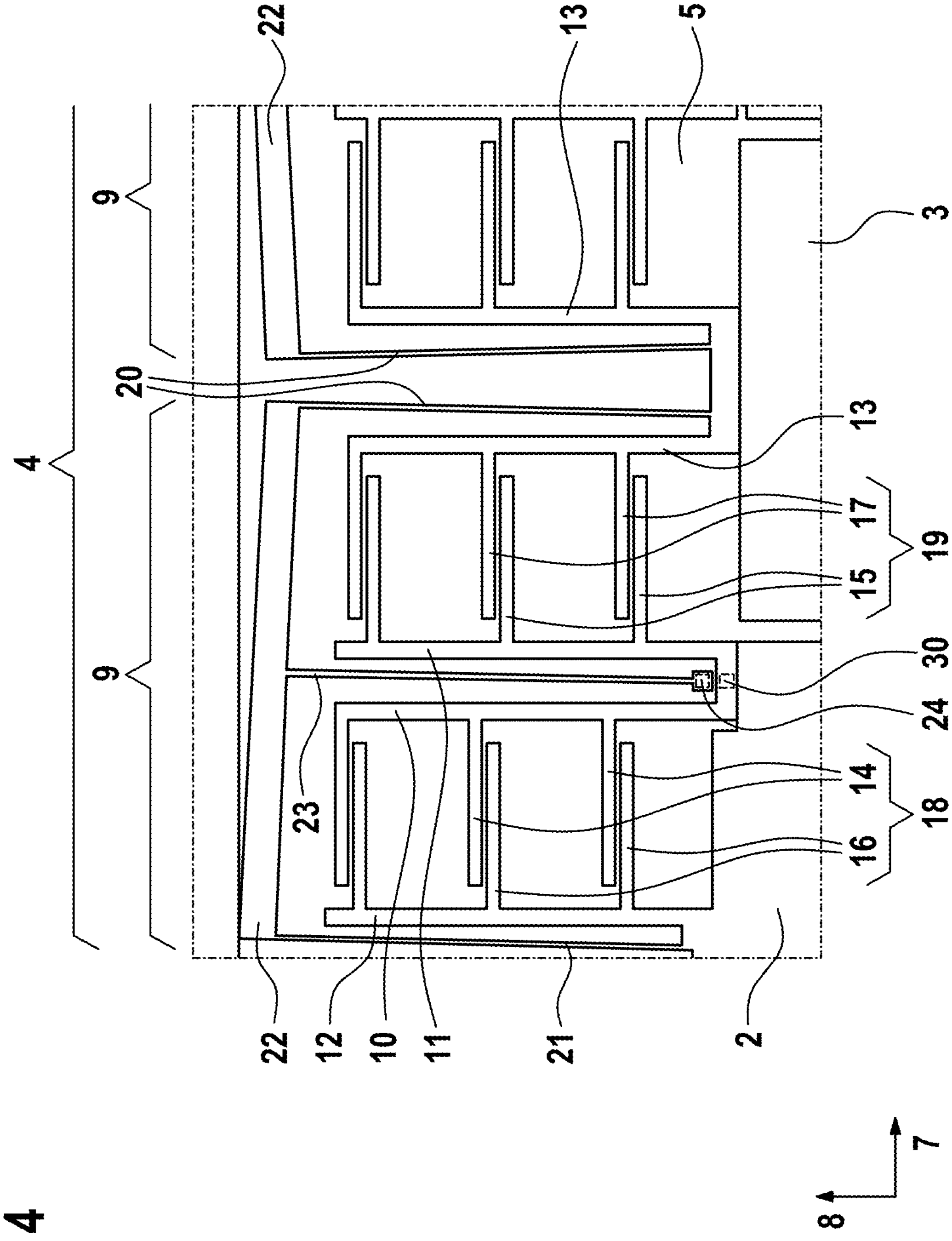
FIG. 4 shows an enlarged detail of the MEMS sensor of FIG. 3.
Figure 5:
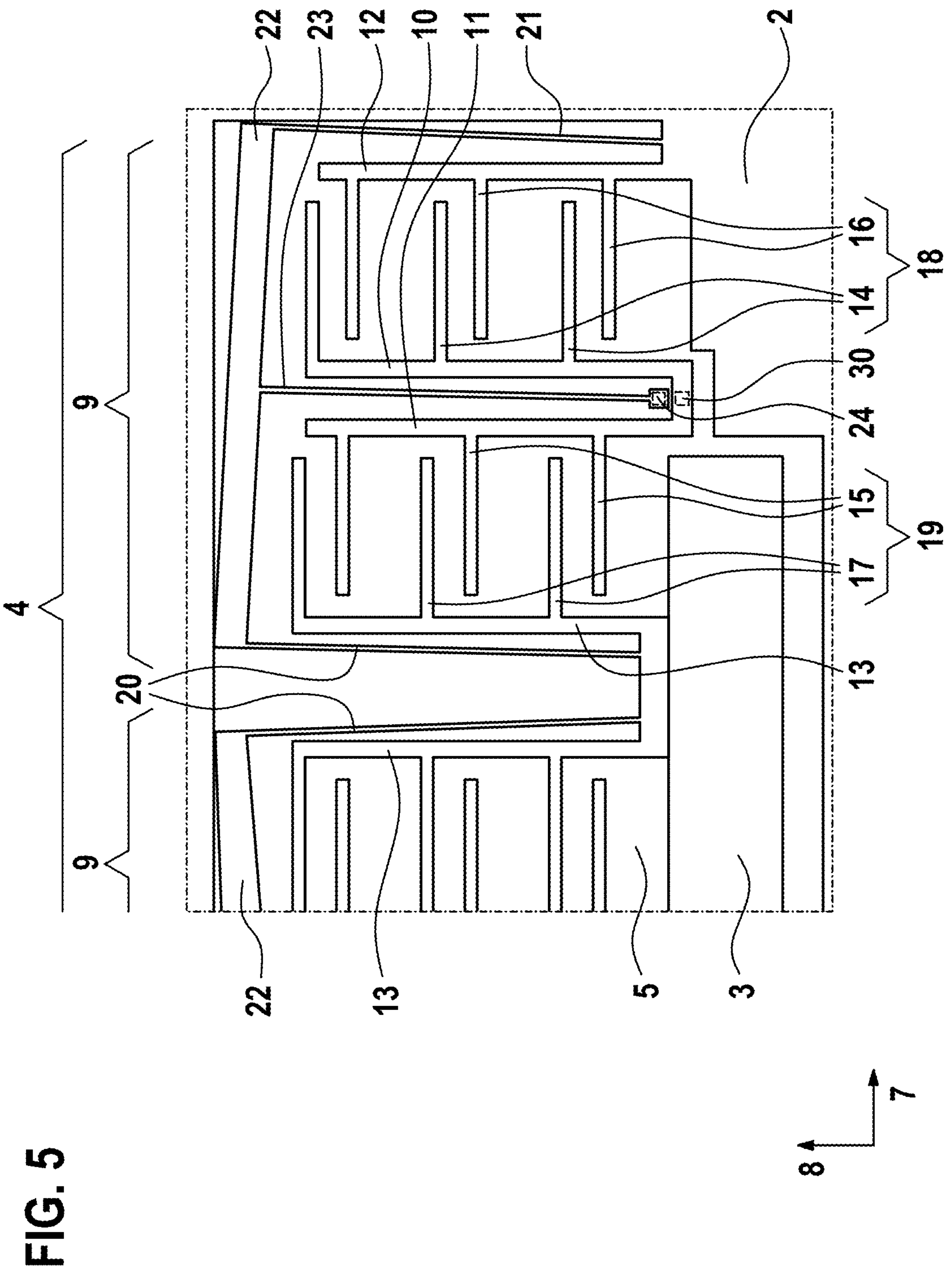
FIG. 5 shows another enlarged detail of the MEMS sensor of FIG. 3.

FIG. 4 and FIG. 5 respectively show an enlarged region of FIG. 3, wherein two electrode systems 4 connected to the lightweight masses 3, which experience an opposite deflection relative to the heavy mass 2, are shown separately. The previously used reference signs are retained.

In the case of an opposite deflection of the lightweight masses 3, a deflection of the movable electrode surfaces 16, 17 of the relevant electrode systems 4 perpendicular to the electrode surfaces 14, 15, 16, 17 is caused since they are firmly connected to the seismic masses 2, 3. As a result, distances between the fixed electrode surfaces 14, 15 and the movable electrode surfaces 16, 17 of the first and second electrical capacitances 18, 19 of the electrode structures 9 change. While the opposite deflection of the lightweight mass 3 connected to the electrode system 4 induces a decrease in the distances between the fixed and the movable electrode surfaces 14, 15, 16, 17 in the electrode system 4 of FIG. 4, the opposite deflection of the lightweight mass 3 in the electrode system 4 of FIG. 5, which can be produced by mirroring the electrode system 4 of FIG. 4 on a first axis of symmetry 25, causes an increase in the distances between the fixed and the movable electrode surfaces 14, 15, 16, 17. As a result, an acceleration-dependent measurement signal can be generated.

Figure 6:
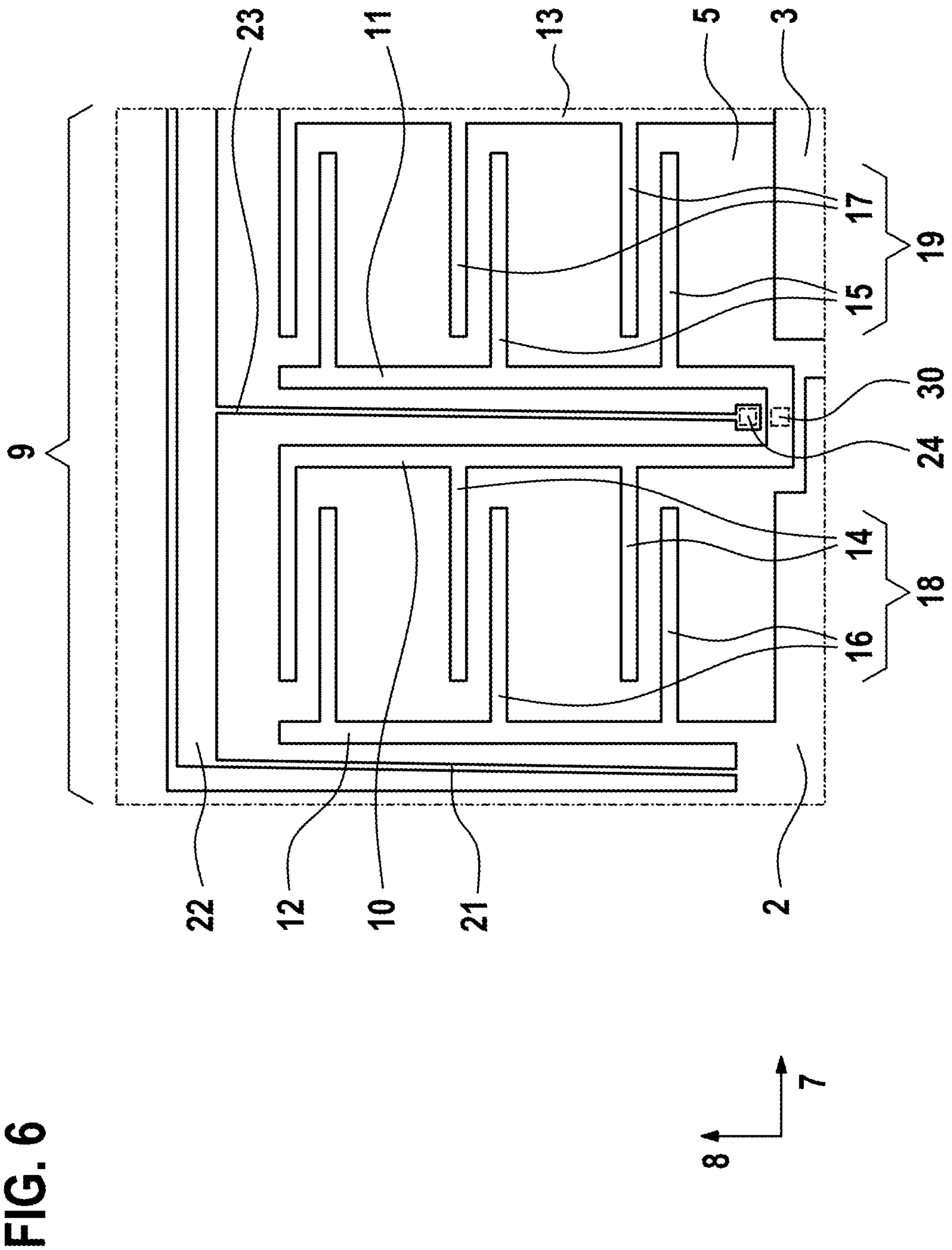
FIG. 6 shows yet another enlarged detail of the MEMS sensor of FIG. 3.

The seismic masses 2, 3 are furthermore coupled to one another such that a deflection of the heavy mass 2 parallel to the substrate and in a direction parallel to fixed and movable electrode surfaces 14, 15, 16, 17 of two further electrode systems 4 that are opposing in the second direction 8 causes the lightweight masses 3 connected to the further electrode systems 4 that are opposing in the second direction 8 to be deflected in the same direction. Such an electrode system is shown by way of example in FIG. 6, wherein previously used reference signs are retained. It can be seen that the distances between the fixed and the movable electrode surfaces 14, 15, 16, 17 do not change, since the relevant lightweight mass 3 is deflected in a direction parallel to the fixed and movable electrode surfaces 14, 15, 16, 17.

Only the opposite deflection of two lightweight masses 3 in relation to the heavy mass 2 thus contributes to a measurement signal. Due to its fully symmetrical arrangement, the MEMS sensor 1 according to the first embodiment has the property that it has no cross-sensitivity between measurements in the first direction 7 and measurements in the second direction 8, i.e., that accelerations that only act in the first or second direction 7, 8 do not generate a signal in the respectively other direction 8, 7. In comparison to MEMS sensors that are not fully symmetrical, a more accurate measurement signal can thereby be provided.

Figure 7:
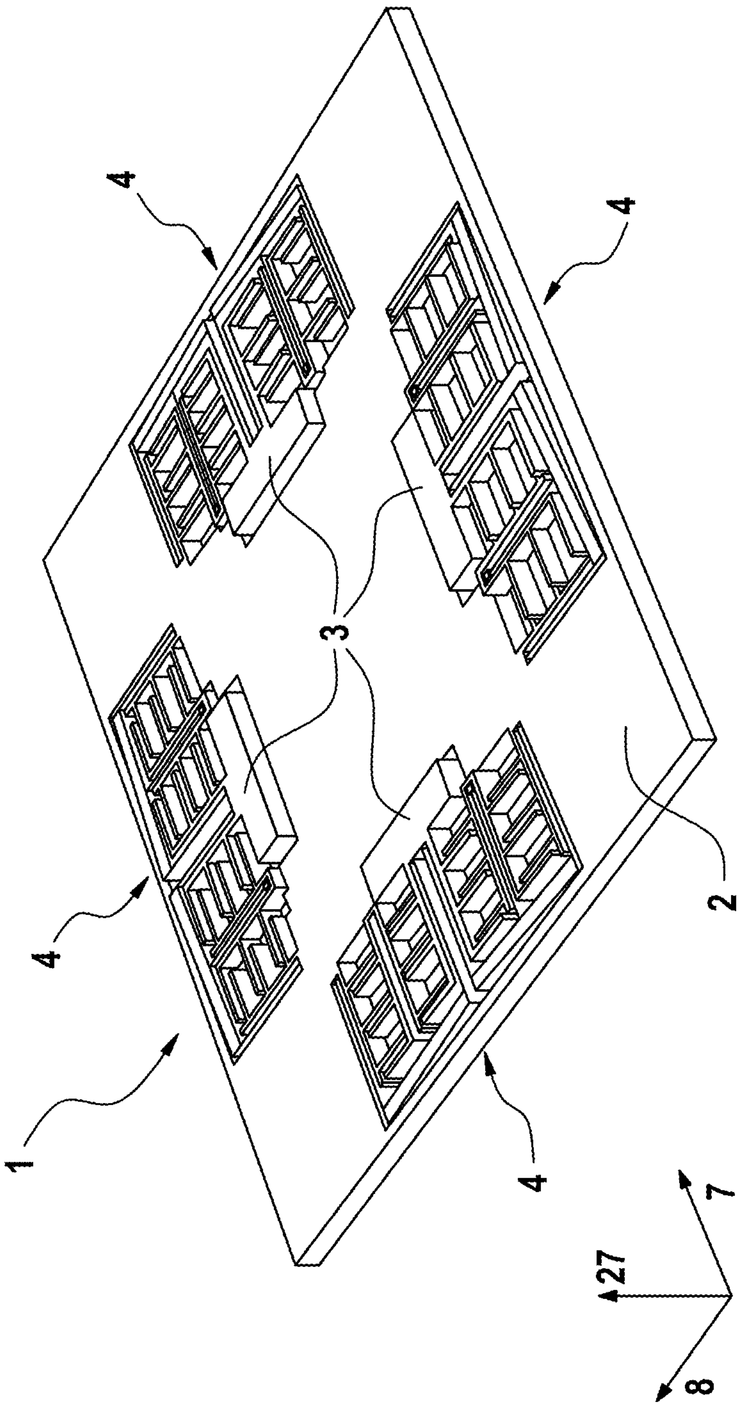
FIG. 7 shows the MEMS sensor of FIG. 1 in a perspective view, with a vertical acceleration acting.
Figure 8:
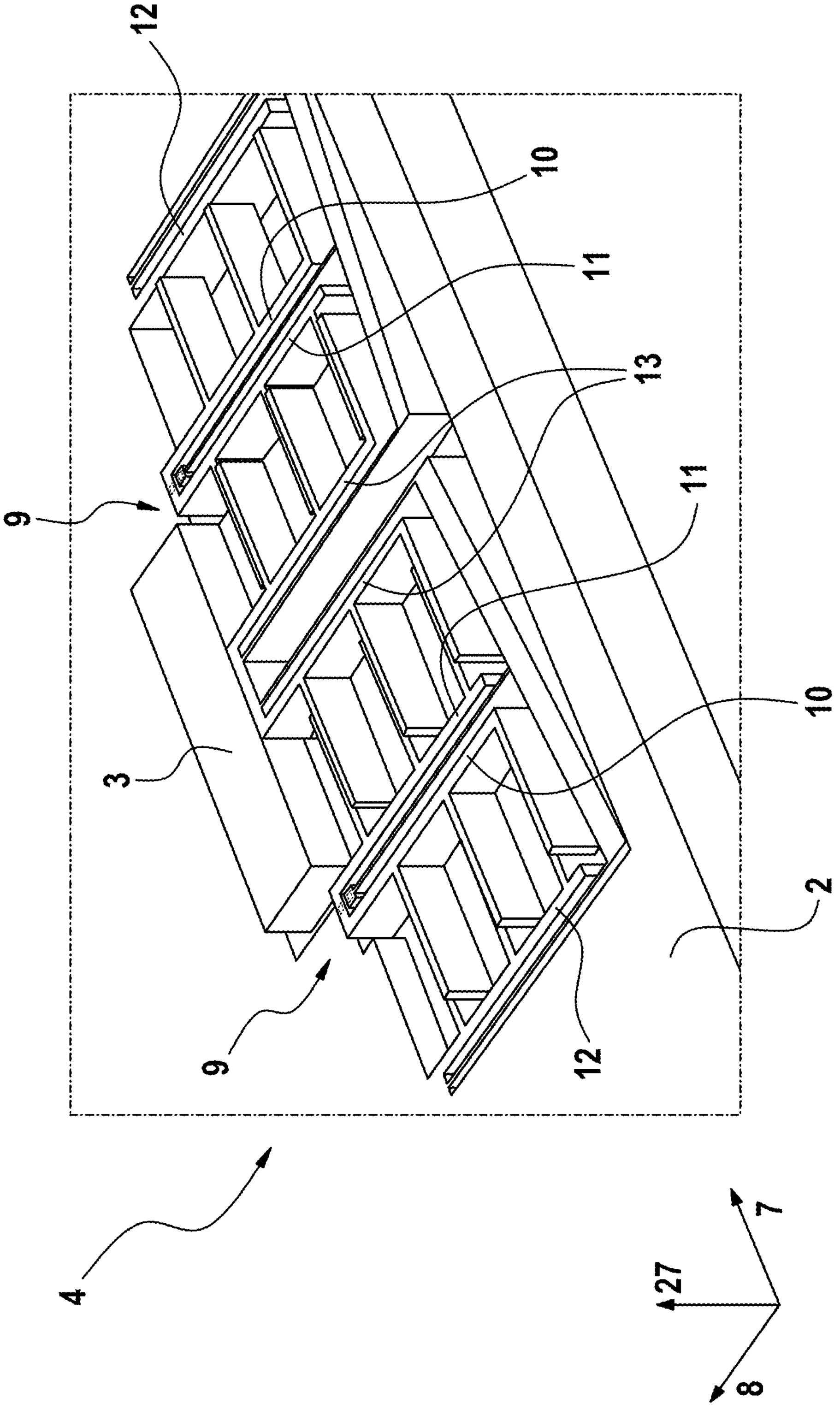
FIG. 8 shows an enlarged detail of the MEMS sensor of FIG. 7.

FIG. 7 schematically shows the MEMS sensor 1 of FIG. 1 in a perspective view. FIG. 8 shows an enlarged region of FIG. 7, with an electrode system 4 being shown by way of example. The previously used reference signs are retained. In contrast to FIG. 1, the MEMS sensor 1 in FIG. 7 and FIG. 8 is shown in a state in which, by way of example, it exhibits an acceleration with a component along a third direction 27 perpendicular to the substrate, which third direction may also be referred to as the z-direction.

The seismic masses 2, 3 are furthermore coupled such that a deflection of the heavy mass 2 in the third direction 27 causes the lightweight masses 3 to be deflected in the opposite direction. As a result, even accelerations that act perpendicularly to the substrate can be measured. With reference to FIG. 1, the heavy mass 2 has additional movable electrode surfaces 28 for this purpose. The additional movable electrode surfaces 28 are each arranged, by way of example, in regions between two lightweight masses 3. By way of example, the MEMS sensor 1 has four additional movable electrode surfaces 28. However, a different number of additional movable electrode surfaces 28 may also be provided, which may also be positioned differently. However, the additional movable electrode surfaces 28 and the additional fixed electrode surfaces may also be omitted.

With additional fixed electrode surfaces arranged on the upper side of the substrate, which additional fixed electrode surfaces are not shown for reasons of clarity, the additional movable electrode surfaces 28 form additional electrical capacitances. In the rest position of the seismic masses 2, 3, the additional fixed and the additional movable electrode surfaces 28 are arranged parallel to one another and to the substrate and are arranged opposing one another. FIG. 8 shows that the additional fixed and the additional movable electrode surfaces 28 are arranged parallel to one another not only in the rest position of the seismic masses 2, 3 but also in the case of a deflection perpendicular to the substrate. This is because the seismic masses 2, 3 remain substantially aligned parallel to one another despite their deflection and the fact that no connecting bars are formed between the heavy mass 2 and the lightweight masses 3.

Figure 9:
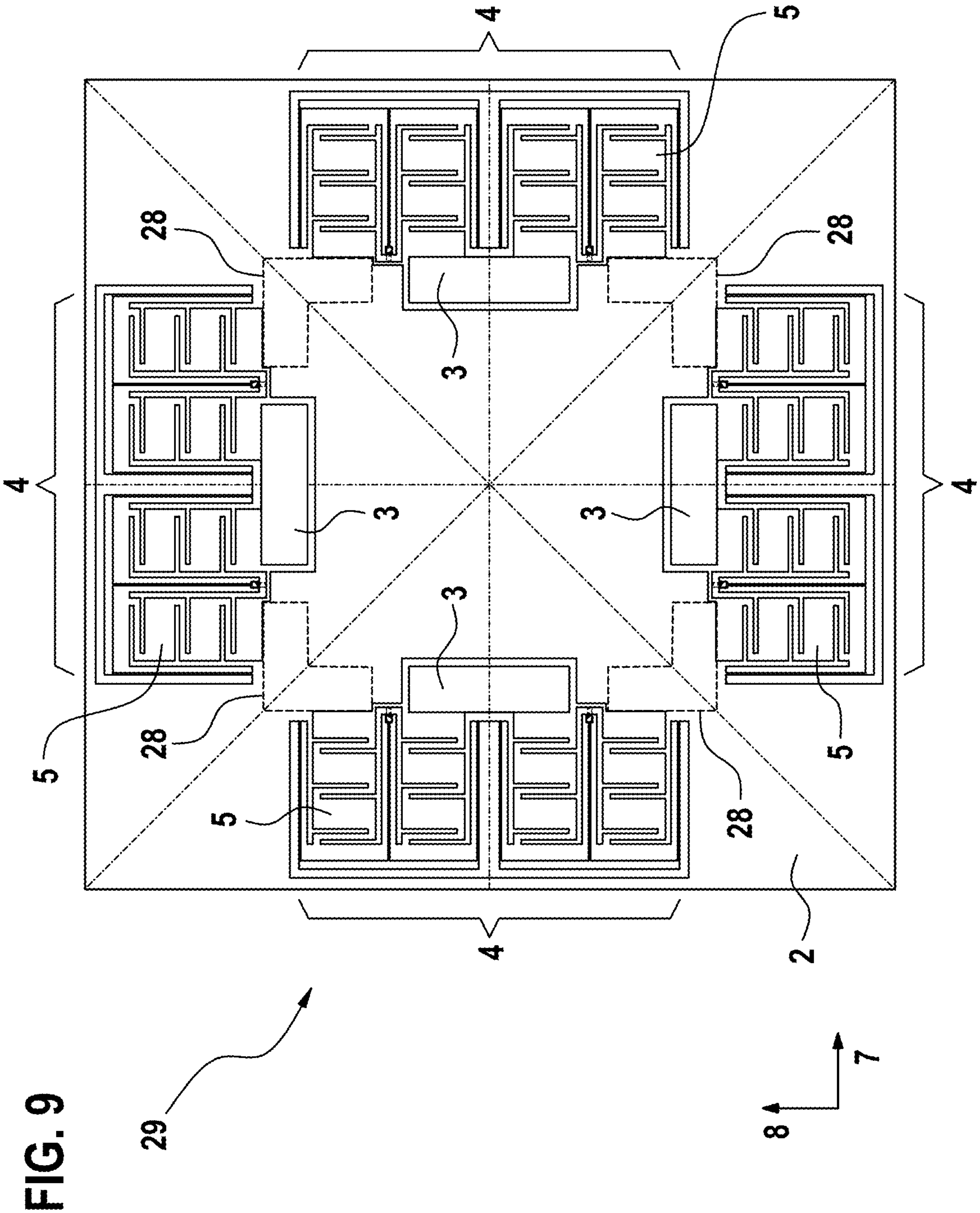
FIG. 9 shows a MEMS sensor according to a second example embodiment of the present invention in a plan view.
Figure 10:
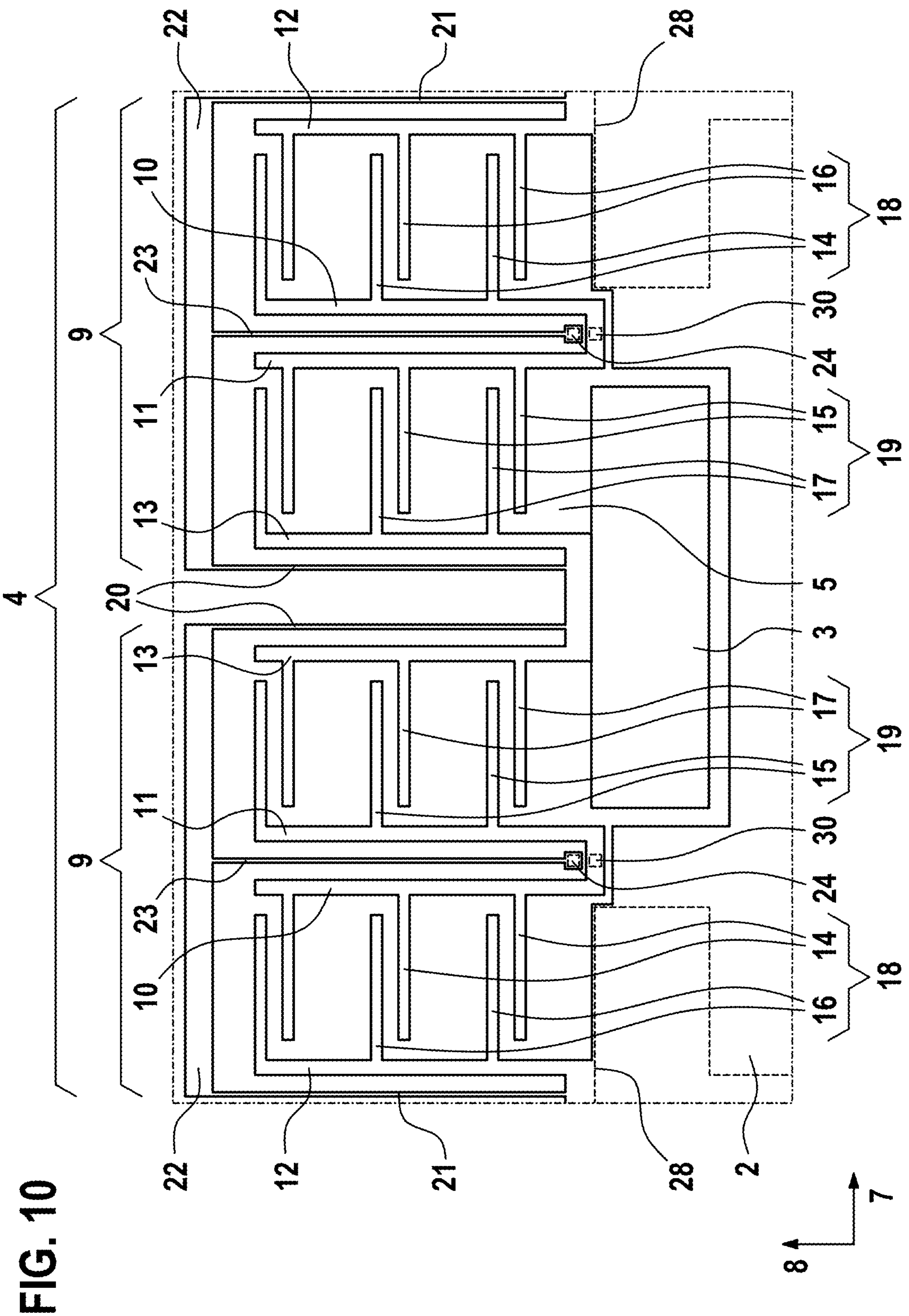
FIG. 10 shows an enlarged detail of the MEMS sensor of FIG. 1.

FIG. 9 schematically shows a microelectromechanical acceleration sensor 29 according to a second embodiment in a plan view. The MEMS sensor 29 according to the second embodiment has similarities to the MEMS sensor 1 according to the first embodiment. Only the differences will be explained below. FIG. 10 schematically and by way of example shows one of the electrode systems 4 of the MEMS sensor 29 of FIG. 9 in a plan view. The views of FIGS. 9 and 10 of the MEMS sensor 29 according to the second embodiment thus correspond to the views of FIGS. 1 and 2 of the MEMS sensor 1 according to the first embodiment. The previous reference signs are retained.

In contrast to the MEMS sensor 1 according to the first embodiment, in the MEMS sensor 29 according to the second embodiment, the fixed and movable electrode surfaces 14, 15, 16, 17 of the first and second electrical capacitances 18, 19 are arranged such that directly adjacent first and directly adjacent second electrical capacitances 18, 19 of the electrode systems are in each case formed in opposite directions. As a result, the MEMS sensor 29 according to the second embodiment has no axes of symmetry 25, 26 and is only rotationally symmetrical with a four-fold rotation axis. The electrode systems 4 on their own therefore also do not have any axial symmetry. Rather, the electrode systems 4 of the MEMS sensor 29 according to the second embodiment have a translational symmetry, since the electrode structures 9 of an electrode system 4 can be transferred into one another by translation.

In other words, in the MEMS sensor 29 according to the second embodiment, directly adjacent first movable electrode surfaces 16 and directly adjacent second movable electrode surfaces 17 are in each case on opposing sides of the fixed electrode surfaces 14, 15 in relation to a direction perpendicular to the electrode surfaces 14, 15, 16, 17 of the electrode structures 9.

With reference to FIG. 2, in the MEMS sensor 1 according to the first embodiment, directly adjacent first movable electrode surfaces 16 and directly adjacent second movable electrode surfaces 17 are in each case arranged on sides, facing one another, of the fixed electrode surfaces 14, 15 in relation to a direction perpendicular to the electrode surfaces 14, 15, 16, 17 of the electrode structures 9. As a result, directly adjacent first electrical capacitances 18 and directly adjacent second electrical capacitances 19 are formed in the same direction. This can be seen particularly clearly in FIGS. 4 and 5. In this case, the distances between the electrodes 14, 15, 16, 17 of directly adjacent first and directly adjacent second electrical capacitances 18, 19 decrease or increase together. In the case of opposite, directly adjacent first and directly adjacent second capacitances 18, 19, the distances within one electrode structure 9 of an electrode system 4 decrease, while the distances within the other electrode structure 9 of the relevant electrode system 4 increase.

The microelectromechanical acceleration sensors 1, 29 according to the first and second embodiments have the common feature that the fixed combs of an electrode structure 9 are in each case connected to a common anchor 30. The anchors 30 are arranged on the upper side of the substrate. The suspensions 24 and the anchors 30 of the electrode structures 9 are arranged one behind the other in a direction perpendicular to the fixed and movable electrode surfaces 14, 15, 16, 17 of the electrode structures 9.

Bending of the substrate, for example due to thermal effects, can cause a displacement of the anchors 30 relative to the suspensions 24. However, this results in a change in the distances between the fixed and the movable electrode surfaces 14, 15, 16, 17 of the electrical capacitances 18, 19. Preferably, the suspensions 24 and the anchors 30 of each electrode structure 9 can in each case be arranged close to one another as shown in FIGS. 2 and 10. This can at least partially reduce the influence of the substrate bending. However, the suspensions 24 and the anchors 30 cannot be arranged arbitrarily close to one another, since this can be technically problematic and since a stability of the suspensions 24 and of the anchors 30 may be reduced because the suspensions 24 and the anchors 30 have to be smaller if they are arranged as close as possible to one another.

For this reason, the MEMS sensors 1, 29 according to the first and second embodiments have the property that the first movable electrode surfaces 16 and the second movable electrode surfaces 17 of the electrode structures 9 are in each case arranged on opposing sides of the fixed electrode surfaces 14, 15 of the first and second fixed combs in relation to a direction perpendicular to the electrode surfaces 14, 15, 16, 17 of the electrode structures 9. In the event of substrate bending and a displacement of the suspensions 24 relative to the anchors 30, the first electrical capacitances 18 and the second electrical capacitances 19 of an electrode structure 9 are formed in opposite directions as a result. The effect of substrate bending is in this way compensated within an electrode structure 9. By segmenting the MEMS sensors 1, 29 into a total of eight electrode structures 9, this influence is further reduced.

Figure 11:
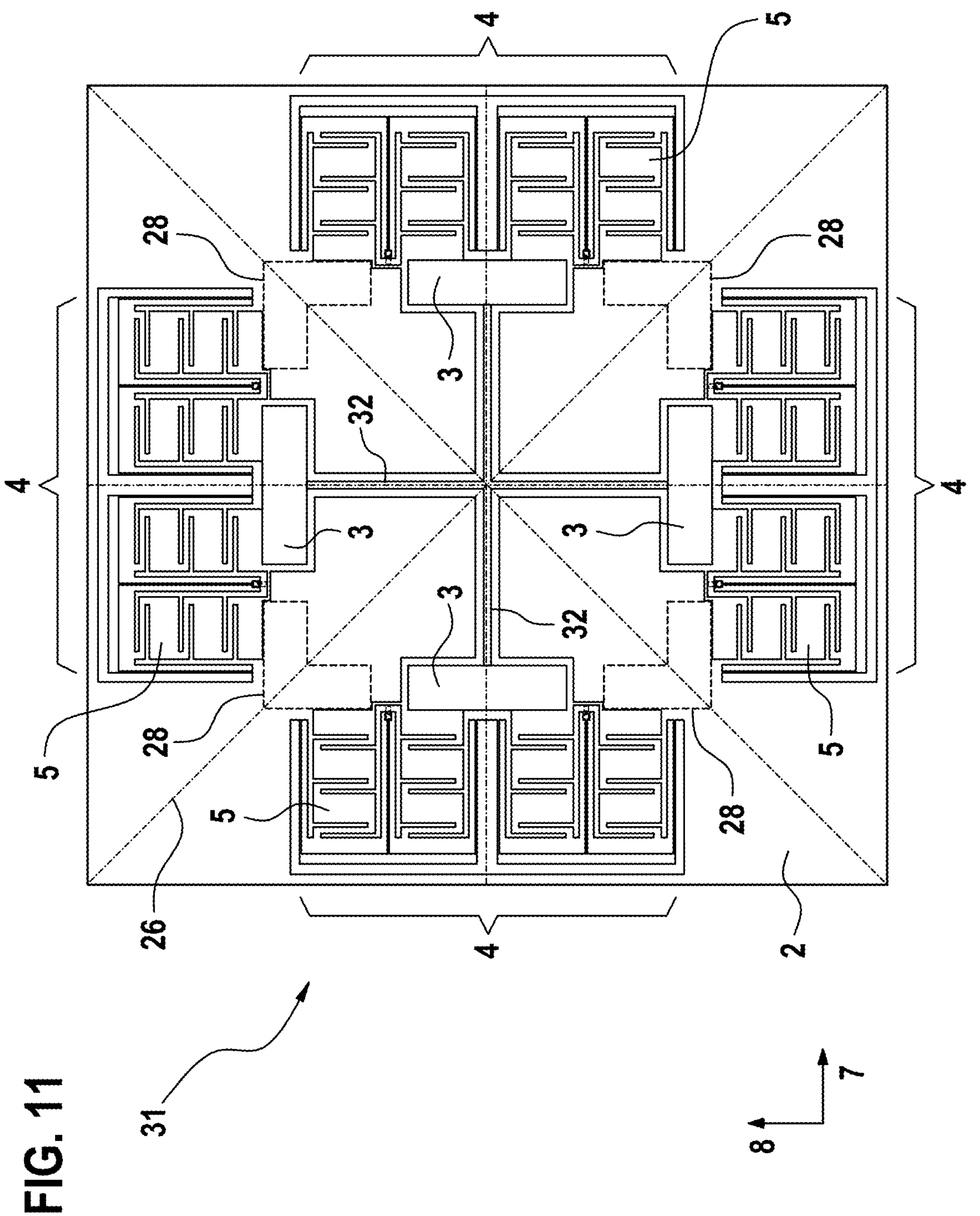
FIG. 11 shows a MEMS sensor according to a third example embodiment of the present invention in a plan view.

FIG. 11 schematically shows a microelectromechanical acceleration sensor 31 according to a third embodiment in a plan view. The MEMS sensor 31 according to the second embodiment has similarities to the MEMS sensor 1 according to the first embodiment. Only the differences will be explained below. However, the additional features in comparison to the MEMS sensor 1 according to the first embodiment can also be realized in the MEMS sensor 29 according to the second embodiment. The previous reference signs are retained.

In the MEMS sensor 31 according to the third embodiment, the lightweight masses 3 are connected to one another via connecting bars 32. The MEMS sensor 31 has a total of two connecting bars 32, each of which connects two opposing lightweight masses 3 to one another. Due to the symmetry of the MEMS sensor 31, the connecting bars 32 cross and are also connected to one another. However, the connecting bars 32 may also be omitted.

What is claimed is:

1. A microelectromechanical acceleration sensor, comprising:

a substrate;

a heavy mass movably suspended above an upper side of the substrate;

four lightweight masses movably suspended above the upper side of the substrate, wherein the heavy mass is heavier than the total mass of the four lightweight masses; and four electrode systems arranged above the upper side of the substrate;

wherein the heavy mass laterally encloses the lightweight masses and the electrode systems, wherein the electrode systems are arranged such that the microelectromechanical acceleration sensor has a four-fold rotational symmetry with respect to a rotation axis perpendicular to the substrate, wherein each of the electrode systems has two electrode structures arranged next to one another, wherein each of the electrode structures has a first fixed electrode, a second fixed electrode, a first movable electrode, and a second movable electrode, wherein the first movable electrodes of each of the electrode systems are arranged on sides, facing away from one another, of the electrode structures of the electrode system and are each firmly connected to the heavy mass, and the second movable electrodes of an electrode system are arranged on sides, facing one another, of the electrode structures of a corresponding electrode system and are each firmly connected to a lightweight mass, wherein the first and second fixed electrodes of the electrode structures each have a first and second fixed comb of first and second fixed electrode surfaces, which are oriented perpendicularly to the substrate and project parallel to the substrate in opposite directions, wherein the first and second movable electrodes of the electrode structures each have a first and second movable comb of first and second movable electrode surfaces, which are arranged parallel to the first and second fixed electrode surfaces and project in opposite directions, wherein the first movable comb and the first fixed comb of each of the electrode structures interleave and form first electrical capacitances, and the second movable comb and the second fixed comb of each of the electrode structures interleave and form second electrical capacitances, wherein the heavy mass and the lightweight masses are coupled to one another such that a deflection of the heavy mass parallel to the substrate and in a direction perpendicular to the fixed and movable electrode surfaces of two opposing ones of the electrode systems causes the lightweight masses connected to the opposing electrode systems to be deflected in an opposite direction.

2. The microelectromechanical acceleration sensor according to claim 1, wherein the electrode systems are axially symmetrical with respect to an axis of symmetry extending perpendicularly to the fixed and movable electrode surfaces and between the electrode structures.

3. The microelectromechanical acceleration sensor according to claim 2, wherein the microelectromechanical acceleration sensor has four axes of symmetry parallel to the substrate.

4. The microelectromechanical acceleration sensor according to claim 1, wherein the fixed and movable electrode surfaces of the first and second electrical capacitances are arranged such that directly adjacent first and directly adjacent second electrical capacitances of the electrode systems are each formed in opposite directions.

5. The microelectromechanical acceleration sensor according to claim 1, wherein:

on sides, facing one another, of the electrode structures of the electrode systems, the lightweight masses are each connected to two inner spring elements, which, in a rest position of the heavy and lightweight masses are aligned perpendicularly to the fixed and to the movable electrode surfaces, on sides, facing away from one another, of the electrode structures of the electrode systems, the heavy mass is in each case connected to two outer spring elements, which, in the rest position of the heavy and lightweight masses, are aligned perpendicularly to the fixed and to the movable electrode surfaces, respective inner and outer spring elements are in each case connected in pairs to a respective lever element, which, in the rest position of the heavy and lightweight masses, is aligned parallel to the fixed and to the movable electrode surfaces, such that a respective inner spring element, a respective outer spring element and the respective lever element in each case laterally enclose an electrode structure of an electrode system, via a respective further spring element, which projects between the fixed combs of each of the electrode structures and, in the rest position of the heavy and lightweight masses, is arranged perpendicularly to the respective lever elements, the respective lever elements are each connected to suspensions arranged on the upper side of the substrate.

6. The microelectromechanical acceleration sensor according to claim 5, wherein directly adjacent ones of the inner spring elements are connected to one another.

7. The microelectromechanical acceleration sensor according to claim 5, wherein directly adjacent ones of the outer spring elements are connected to one another.

8. The microelectromechanical acceleration sensor according to claim 5, wherein:

the fixed combs of each of the electrode structures are connected to a common anchor, the suspensions and the anchors of the electrode structures are each arranged one behind the other in a direction perpendicular to the fixed and movable electrode surfaces of the electrode structures, the first movable electrode surfaces and the second movable electrode surfaces of the electrode structures are each arranged on opposing sides of the fixed electrode surfaces of the first and second fixed combs in relation to a direction perpendicular to the electrode surfaces of the electrode structures.

9. The microelectromechanical acceleration sensor according to claim 1, wherein the lightweight masses are connected to one another via connecting bars.

10. The microelectromechanical acceleration sensor according to claim 1, wherein:

the heavy mass has additional movable electrode surfaces, additional fixed electrode surfaces are arranged on the upper side of the substrate, in the rest position of the heavy and lightweight masses, the additional fixed and the additional movable electrode surfaces are arranged parallel to one another and to the substrate, are arranged opposite one another and form additional electrical capacitances, the heavy and lightweight masses are coupled such that a deflection of the heavy mass in a direction perpendicular to the substrate causes the lightweight masses to be deflected in an opposite direction.

* * * * *